(12) United States Patent
Uemura et al.

(10) Patent No.: US 6,335,212 B1
(45) Date of Patent: Jan. 1, 2002

(54) METHOD OF FABRICATING A SEMICONDUCTOR LIGHT-EMITTING ELEMENT

(75) Inventors: Toshiya Uemura; Takahide Oshio, both of Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/599,556

(22) Filed: Jun. 23, 2000

(30) Foreign Application Priority Data

Jun. 28, 1999 (JP) ............................................ 11-181897

(51) Int. Cl.[7] ............................................. H01L 21/00
(52) U.S. Cl. ....................................................... 438/26
(58) Field of Search .............................. 438/26, 29, 46, 438/47, 779, 780, 781; 257/81, 94, 95, 98, 100; 427/335, 336

(56) References Cited

U.S. PATENT DOCUMENTS 5,476,884 A * 12/1995 Kayaba et al. .............. 523/443
5,514,627 A * 5/1996 Lowery et al. ............... 438/26

* cited by examiner

*Primary Examiner*—Keith Christianson
(74) *Attorney, Agent, or Firm*—Pillsbury Winthrop LLP

(57) ABSTRACT

A device and a method for fabricating said device provides a semiconductor light-emitting element having an electrode and a protective film layer that is sealed with an insulating resin, which is hardened at high temperature. After completion of the hardening process, the semiconductor light-emitting element is heat treated in an atmosphere of normal or higher humidity. Preferably, the heat treatment is performed at a temperature of 60° C. or higher in an atmosphere having an absolute humidity of 10 KPa or higher. When the heat treatment is performed at or above 10 KPa, the heat treatment can be completed within a shorter timeframe in comparison to such a device heat treated at an absolute humidity of less than 10 kPa.

12 Claims, 6 Drawing Sheets

FIG. 3

TEMPERATURE DEPENDENCY AT 90%RH

| | TEMPERATURE (°C) | HEAT TREATMENT TIME (hr) | | | | | | | | |
|---|---|---|---|---|---|---|---|---|---|---|
| | | 25 | 50 | 75 | 100 | 150 | 200 | 300 | 500 | 1000 |
| ① | 40 | × | × | × | × | × | × | × | × | × |
| ② | 60 | × | × | × | × | × | × | × | ○ | ○ |
| ③ | 70 | × | × | × | ○ | ○ | ○ | ○ | ○ | ○ |
| ④ | 85 | × | ○ | ○ | ○ | ○ | ○ | ○ | ○ | ○ |

○ ... LIGHT-EMITTING CHARACTERISTICS NOT CHANGED
× ... LIGHT-EMITTING CHARACTERISTICS CHANGED

FIG. 5

HUMIDITY DEPENDENCY AT 85°C

| | RH (%) | HEAT TREATMENT TIME (hr) | | | | |
|---|---|---|---|---|---|---|
| | | 25 | 50 | 75 | 100 | 125 |
| A | 30 | X | X | X | O | O |
| B | 50 | X | X | O | O | O |
| C(④) | 90 | X | O | O | O | O |

O ⋯LIGHT-EMITTING CHARACTERISTICS NOT CHANGED

X ⋯LIGHT-EMITTING CHARACTERISTICS CHANGED

US 6,335,212 B1

METHOD OF FABRICATING A SEMICONDUCTOR LIGHT-EMITTING ELEMENT

BACKGROUND OF THE INVENTION

1. Field of the Invention

The present invention relates to a semiconductor light-emitting device and a method of manufacturing said same device, and more particularly to a method of fabricating a semiconductor light-emitting element containing a nitride of a Group III element (hereinafter referred to as a "Group-III nitride compound semiconductor light-emitting element").

2. Description of the Related Art

FIG. 1 is a schematic view illustrating an exemplary structure of a light-emitting diode 200 which is subjected to heat treatment according to the present invention. As shown in FIG. 1, a wire-bonding-type semiconductor light-emitting element 100 mounts onto an upper flat portion 203 of a lead 201. A negative electrode 140 connects to the lead 201 by means of a wire 204. A thick-film positive electrode 120 serving as an electrode pad for wire bonding connects to a lead 202 by means of a wire 205. Subsequently, a body that functions as a lens is formed from an insulating resin 206 such as epoxy resin through, for example, a potting process.

FIG. 2 is a schematic cross section of the semiconductor light-emitting element 100. Reference numeral 101 denotes a sapphire substrate; 102 denotes an aluminum nitride (AlN) buffer layer; 103 denotes an n-type gallium nitride (GaN) layer; 104 denotes an n-type (GaN) cladding layer; 105 denotes a light-emitting layer; 106 denotes a p-type aluminum gallium nitride AlGaN cladding layer; 107 denotes a p-type GaN contact layer; 110 denotes a thin-film positive electrode for dispersing current into the contact layer 107 within a wide region; 120 denotes a thick-film positive electrode serving as an electrode pad for wire bonding; 130 denotes a protective film layer; and 140 denotes a negative electrode.

The protective film layer 130 is formed from oxide film such as $SiO_x$ nitride film such as $SiN_x$ so that the protective film layer 130 has light-transmission capability and insulation capability.

After the completion of the wire bonding process, the light-emitting element 100 is sealed by the insulating resin 206 such as epoxy resin from the upper side (the protective film layer 130 side) thereof such that the protective film layer 130 and the exposed surfaces of the electrodes 120 and 140 are covered by the insulating resin 206. Then, the insulating resin 206 is hardened at a temperature of one hundred and several tens of degrees centigrade.

When the light-emitting diode 200 is allowed to return to room temperature after the hardening of the insulating resin 206 such as epoxy resin, thermal shrinkage of the insulating resin 206 causes stresses to act on the light-emitting element 100. Once these stresses are formed, they remain within the insulating resin 206. When a high-load durability test (a drive test performed at a high temperature, a high humidity, and a large current for an extended period of time) is performed on the light-emitting element 100 that contains such stresses, additional stresses are generated due to a temperature gradient generated inside the light-emitting element 100. These additional stresses act, especially, on the protective film layer 130 as well as on the thin-film positive electrode 110 and the like via the protective film layer 130.

The temperature gradient is generated, because the p-type GaN contact layer 107 contains both a high current-density portion and a low current-density portion (see FIG. 2). The p-type GaN contact layer 107 contains a portion that is located directly under the thin-film positive electrode 110 which has a high current density. In addition, another portion, such as a stepped portion S, which is not covered with the thin-film positive electrode 110 possesses a very low current density.

The above-described stresses raise no problem under ordinary fabrication conditions or ordinary conditions of use. However, when the light-emitting diode 200 is subjected to severe conditions; for example, when the hardening temperature of the insulating resin 206 is set to 200° C. or higher with the resultant generation of excessively large residual stresses, or when the light-emitting diode 200 is subjected to a high-load durability test requiring an extended period of time; the state of the contact surface of the protective film layer 130 in contact with the thin-film positive electrode 110 changes partially, resulting in a possibility of the light-emission characteristics being affected.

Accordingly, in order to secure reliably the light-emitting element 100 under such severe conditions, there have been demands to improve the quality of materials and to properly set (regulate) potting conditions, hardening conditions, and other conditions.

SUMMARY OF THE INVENTION

The invention overcoming these and other problems in the art relates to a device and a method of manufacturing a semiconductor light-emitting element possessing enhanced durability and reliability.

An object of the present invention is to provide a method of fabricating a reliable semiconductor light-emitting element in which the qualities of a protective film layer, a thin-film positive electrode, and other elements remain high even under severe conditions.

Another object of the present invention is to provide a method of fabricating a reliable semiconductor light-emitting element which includes stacked layers of compound semiconductors, electrodes, and a transparent, insulative protection layer. The stacked layers of compounds are sealed with an insulating resin.

In order to achieve the above object, the present invention provides a method of fabricating a semiconductor light-emitting element in which a semiconductor light-emitting element having an electrode and a protective film layer is sealed with an insulating resin. Next, the insulating resin is hardened at high temperature. Then, the semiconductor light-emitting element is heat-treated in an atmosphere of normal or higher humidity.

The heat treatment is preferably performed at a temperature of 60° C. or higher.

The atmosphere preferably has an absolute humidity of not less than 10 KPa, more preferably not less than 50 KPa.

The heat treatment is preferably performed at a pressure of 1 atm or higher.

When the method of the present invention is employed, the insulating resin absorbs moisture during the heat treatment performed after the hardening thereof, so that stresses remaining in the interior surface or on the exterior surface of the light-emitting element are relaxed greatly due to the absorption of moisture.

By virtue of the relaxation of residual stresses, even when the semiconductor light-emitting element is subjected to a high load durability test, which simulates use under severe conditions, the insulating resin 206, the protective film layer 130, the thin-film positive electrode 110, and other components remain unaffected, so that stable light-emission characteristics can be obtained.

Further, the above effect greatly eases the restrictions on the material quality and the potting conditions. As a result, the productivity, as compared with conventional methods, is greatly improved.

When the heat treatment is performed at a temperature of 60° C. or higher or in a processing atmosphere having a high absolute humidity of not less than 10 KPa, remarkable effects are attained through a high degree of moisture-absorbing action. When the heat treatment temperature is set lower than 60° C., completing the heat treatment requires a greatly increased period of time, or obtaining sufficient effect of the heat treatment becomes difficult. Further, the absolute humidity of the heat treatment atmosphere is preferably not less than 10 KPa. When the absolute humidity is lower than 10 KPa, completing the heat treatment requires an increased period of time or obtaining sufficient effect of the heat treatment becomes difficult.

When the heat treatment is performed at a pressure not less than 1 atm, the moisture-absorbing action of the insulating resin is accelerated. Thus, the heat treatment according to the present invention can be completed within a shorter period of time.

The above-described action and effects are generally obtained in the case of a Group-III nitride compound semiconductor element which has at least stacked layers of a binary, ternary, or quaternary semiconductor represented by $Al_xGa_yIn_{1-x-y}N$ ($0 \leq x \leq 1$, $0 \leq y \leq 1$, $0 \leq x+y \leq 1$) and which has an electrode or protective film layer. However, when these semiconductor layers constitute a light-emitting element, preferably a binary or ternary semiconductor is used.

A portion of the Group III elements may be replaced with boron (B) and/or thallium (Tl), and a portion of nitrogen (N) may be replaced with phosphorus (P), arsenic (As), antimony (Sb), or bismuth (Bi).

When an n-type Group-III nitride compound semiconductor layer is formed by use of the above-mentioned semiconductor, silicon (Si), germanium (Ge), selenium (Se), technetium (TC), carbon (C), or any other suitable element may be added as an n-type impurity. Further, zinc (zn), magnesium (Mg), beryllium (Be), calcium (Ca), strontium (Sr), barium (Ba), or any other suitable element may be added as a p-type impurity.

A substrate on which these semiconductor layers are formed through crystal growth is preferably formed of sapphire but may alternatively be formed of a monocrystal of spinel, silicon (Si), silicon carbide (SiC), zinc oxide (ZnO), magnesium oxide (MgO), or a Group-III nitride compound, or any other suitable material.

A buffer layer is preferably formed of aluminum nitride (AlN) but may be formed of $Al_xGa_{1-x}N$ ($0 \leq x \leq 1$), which is generally grown at low temperature.

Examples of effective methods for growing these semiconductor layers include molecular beam epitaxy (MBE), metal organic chemical vapor deposition (MOCVD), halide vapor epitaxy (HDVPE), and liquid phase epitaxy.

In order to increase the light-emitting efficiency of the light-emitting element, a light-reflecting layer may be formed on the reverse surface of the substrate. The light reflection layer may be formed of a single metal selected from aluminum (Al), indium (In), copper (Cu), silver (Ag), platinum (Pt), iridium (Ir), palladium (Pd), rhodium (Rh), tungsten (W), molybdenum (Mo), titanium (Ti), and nickel (Ni) or an alloy containing one or more of these metals.

The light-emitting element including the above-described Group-III nitride compound semiconductor layers may assume a homo structure, a hetero structure, or a double-hetero structure. These structures can be formed through formation of, for example, a MIS junction, a PIN junction, or a pn junction.

Particularly, the light-emitting layer may assume a single quantum well (SQW) structure or a multiple quantum well (MQW) structure including a well layer and a barrier layer having a band gap greater than that of the well layer.

The effects and benefits of the present invention can be attained through the use of any of the various semiconductor elements possessing any of the above-described structures or configurations. Particularly, the present invention is intended for application to a Group-III nitride compound semiconductor light-emitting element to achieve the above-described action and effects.

BRIEF DESCRIPTION OF THE DRAWINGS

FIG. 3 is a table showing results of an experiment for investigating the temperature dependency of the heat treatment of the present invention;

FIG. 5 is a table showing results of an experiment for investigating the humidity dependency of the heat treatment of the present invention.

DESCRIPTION OF THE PREFERRED EMBODIMENT

An embodiment of the present invention and experiments performed for the embodiment will be described.

Figure 2:
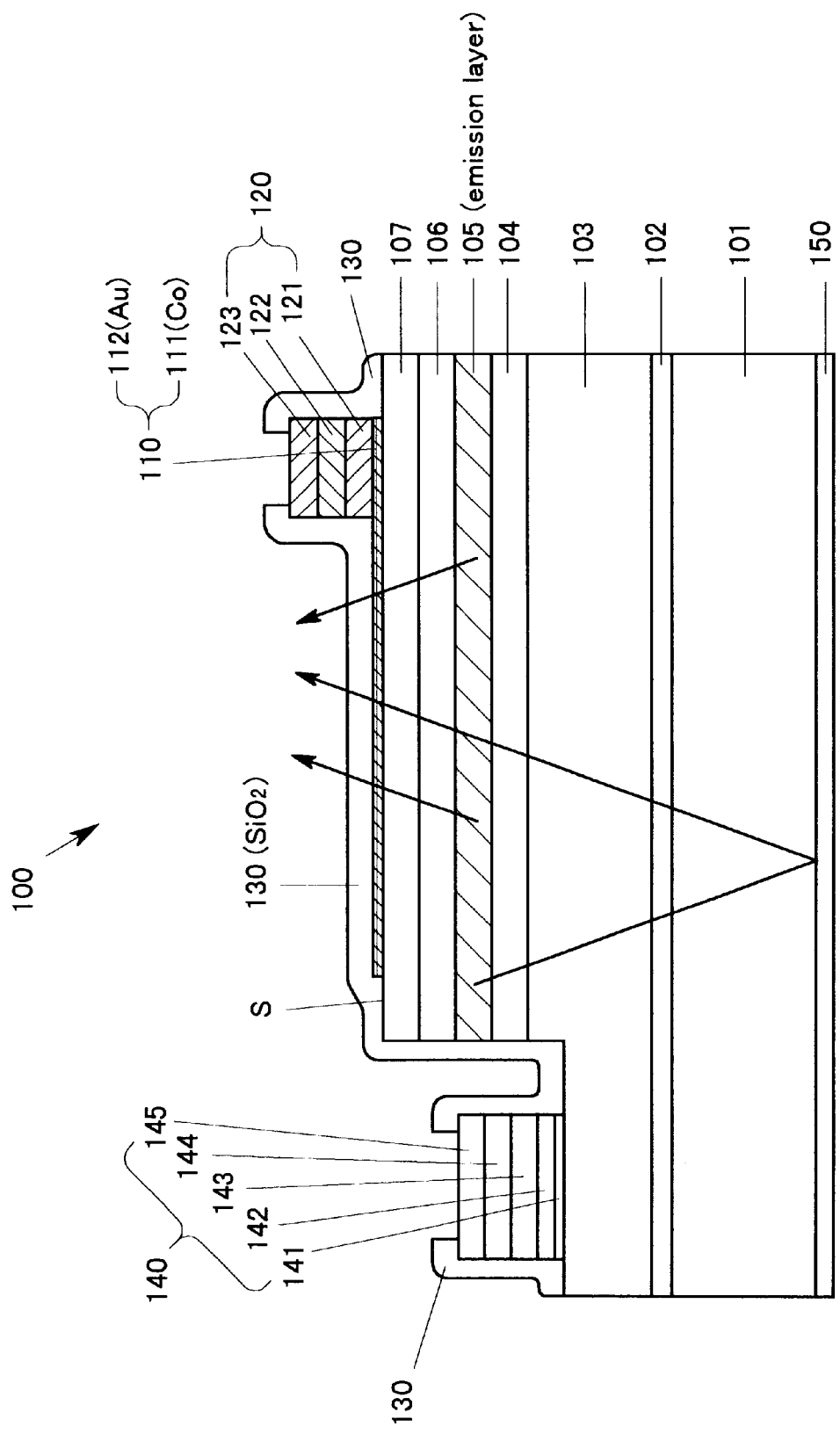
FIG. 2 is a schematic sectional view showing an example structure of a compound semiconductor light-emitting element that constitutes a main portion of the light-emitting diode which is to be subjected to the heat treatment of the present invention.

FIG. 2 shows a cross section of a wire-bonding-type semiconductor light-emitting element 100 that is subjected to the heat treatment of the present invention. A buffer layer 102 of aluminum nitride (AlN) having a thickness of about 200 Å is formed on a sapphire substrate 101, and a high-carrier-density $n^+$ layer 103 of silicon (Si)-doped GaN having a thickness of about 4.0 μm is formed on the buffer layer 102. Further, a cladding layer 104 of silicon (Si)-doped n-type gallium nitride (GaN) having a thickness of about 0.5 μm is formed on the high-carrier-density $n^+$ layer 103.

A light-emitting layer 105 having a thickness of about 500 Å is formed on the cladding layer 104. The light-emitting layer 105 is formed of GaN and $Ga_{0.8}In_{0.2}N$ and has a multiple quantum well structure (MQW). A cladding layer 106 of p-type $Al_{0.15}Ga_{0.85}N$ having a thickness of about 600 Å is formed on the light-emitting layer 105. Further, a contact layer 107 of p-type GaN having a thickness of about 1500 Å is formed on the cladding layer 106.

A thin-film positive electrode 110 is formed on the contact layer 107 through vapor deposition of metal, and a negative electrode 140 is formed on the n+ layer 103. The thin-film positive electrode 110 includes a thin-film positive electrode first layer 111 in contact with the contact layer 107 and a thin-film positive electrode second layer 112 in contact with the first layer 111. The thin-film positive electrode first layer 111 is formed of cobalt (Co) and has a thickness of about 15 Å. The thin-film positive electrode second layer 112 is formed of gold (Au) and has a thickness of about 60 Å.

A thick-film positive electrode 120 is formed on the thin-film positive electrode 110. The thick-film positive electrode 120 includes a thick-film positive electrode first layer 121, a thick-film positive electrode second layer 122, and a thick-film positive electrode third layer 123, which are stacked respectively on the thin-film positive electrode 110. The thick-film positive electrode first layer 121 is formed of vanadium (V) and has a thickness of about 175 Å. The thick-film positive electrode second layer 122 is formed of gold (Au) and has a thickness of about 15000 Å. The thick-film positive electrode third layer 123 is formed of aluminum (Al) and has a thickness of about 100Å.

The negative electrode 140 is formed by a vanadium (V) layer 141 having a thickness of about 175 Å, an aluminum (Al) layer 142 having a thickness of about 1000 Å, a vanadium (V) layer 143 having a thickness of about 500 Å, a nickel (Ni) layer 144 having a thickness of about 5000 Å, and a gold (Au) layer 145 having a thickness of about 8000 Å, which are stacked sequentially on a partially-exposed portion of the high-carrier density n+ layer 103. Further, a protective film layer 130 of $SiO_2$ is formed as an uppermost layer of the semiconductor light-emitting element 100.

Figure 1:
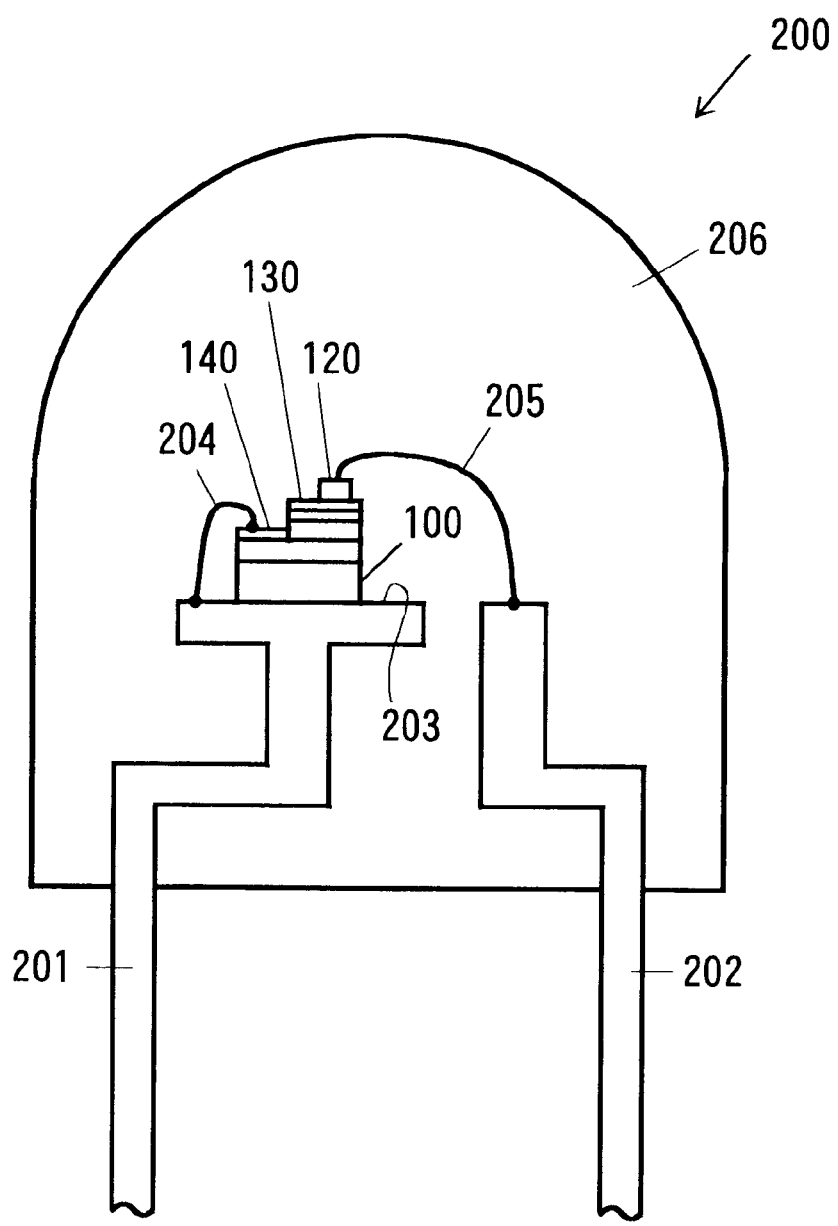
FIG. 1 is a sectional view showing an example structure of a light-emitting diode which is to be subjected to the heat treatment of the present invention.

As shown in FIG. 1, the thus-fabricated semiconductor light-emitting element 100 is mounted on an upper flat portion 203 of a lead 201. The negative electrode 140 is connected to the lead 201 by means of a wire 204. The thickfilm positive electrode 120 serving as an electrode pad for wire bonding is connected a lead 202 by means of a wire 205. Then, a body that functions as a lens is formed from an insulating resin 206 such as epoxy resin through, for example, a potting step. Subsequently, the insulating resin 206 is hardened at a temperature of one hundred and several tens of degrees centigrade.

Next, the invention will be more fully described by way of an example of the method of fabricating the above-described diode 200. The sequence of the method includes: step 1: fabrication of the semiconductor light-emitting element 100, step 2: assembly of the light-emitting diode 200, and step 3: heat treatment of the light-emitting diode 200 (in some cases, these steps may be referred to as "fabrication step 1," "fabrication step 2," and "fabrication step 3," respectively). Step 1: fabrication of the semiconductor light-emitting element 100:

FIG. 2 is a schematic sectional view showing an example structure of the compound semiconductor light-emitting element 100, which constitutes a main portion of the light-emitting diode 200 which is to be subjected to the heat treatment of the present invention.

The light-emitting element 100 was fabricated, for example, through metal organic vapor phase epitaxy (MOVPE). Gases used in the MOVPE method were ammonia ($NH_3$), carrier gas ($H_2$, $N_2$), trimethyl gallium ($Ga(CH_3)_3$) (hereinafter referred to as "TMG"), trimethyl aluminum ($Al(CH_3)_3$) (hereinafter referred to as "TMA"), trimethyl indium ($In(CH_3)_3$) (hereinafter referred to as "TMI"), silane ($SiH_4$), and cyclopentadienyl magnesium (Mg $(C_5H_5)_2$) (hereinafter referred to as "$CP_2Mg$").

First, a substrate 101 of a monocrystal which has been grown such that its "a" face serves as a main face was cleaned by use of organic material and heat treatment. The thus-cleaned substrate 101 was placed on a susceptor provided in a reaction chamber of an MOVPE apparatus. Then, the substrate 101 was baked at 1150° C. under normal pressure in a state in which $H_2$ was continuously fed to the reaction chamber.

Thereafter, the temperature of the substrate 101 was lowered to 400° C., and $N_2$, $NH_3$, and TMA were supplied to the reaction chamber to form a buffer layer 102 of AlN to a thickness of about 200 Å.

Subsequently, the temperature of the substrate 101 was elevated to 1150° C., and $H_2$, $NH_3$, TMG, and silane were supplied to the reaction chamber to form a high-carrier-density n+ layer 103 of silicon (Si)-doped GaN to a thickness of about 4.0 μm, such that the n+ layer 103 had an electron density of $2 \times 10^{18}/cm^3$.

Next, while the temperature of the substrate 101 was maintained at 1100° C., $N_2$ or $H_2$, $NH_3$, TMG, and silane were supplied to the reaction chamber to form a cladding layer 104 of silicon (Si)-doped GaN to a thickness of about 0.5 μm, such that the cladding layer 104 possessed an 925 electron density of $1 \times 10^{18}/cm^3$.

After formation of the cladding layer 104, the crystal temperature was lowered to 850° C., and $N_2$ or $H_2$, $NH_3$, TMG, and TMI were supplied to the reaction chamber to form a light-emitting layer 105 composed of GaN and $Ga_{0.8}In_{-0.2}N$ having thickness of about 500 Å.

Subsequently, after the temperature of the substrate 101 was elevated to 1000° C., $N_2$ or $H_2$, $NH_3$, TMG, TMA, and $CP_2Mg$ were supplied to the reaction chamber to form a cladding layer 106 of magnesium (Mg)-doped p-type $Al_{0.15}Ga_{0.85}N$ to a thickness of about 500 Å.

Next, while the temperature of the substrate 101 was maintained at 1000° C., $N_2$ or $H_2$, $NH_3$, TMG, and $CP_2Mg$ were supplied to the reaction chamber to form a contact layer 107 of Mg-doped p-type GaN to a thickness of about 1000 Å.

Then, an etching mask was formed on the contact layer 107. Portions of the etching mask in predetermined regions were removed. In addition to the uncovered portions of the contact layer 107, the cladding layer 106, the light-emitting layer 105, and the cladding layer 104 were not covered with the mask. A portion of the n+ layer 103 was etched by means of reactive ion etching making use of a gas containing chlorine. Thus, the surface of the n+ layer 103 was exposed.

Afterwards, a negative electrode layer 140 to be joined to the n+ layer 103 and a thin-film positive electrode 110 to be joined to the contact layer 107 were formed in the following steps:

[1] After the interior of a vapor deposition apparatus was evacuated to a high vacuum on the order of $10^{-6}$ Torr or lower, a cobalt (Co) film having a thickness of about 15 Å was uniformly deposited on the surface in order to form a thin-film positive electrode first layer 111. An Au film having a thickness of about 60 Å was deposited onto the thin-film positive electrode first layer 111 to form a thin-film positive electrode second layer 112.

[2] Subsequently, photoresist was uniformly applied onto the surface and then removed through photolithography from the surface except in a portion of the surface at which the thin-film positive electrode 110 was to be formed on the contact layer 107.

[3] Next, the exposed portions of the Co and Au films were removed through etching, and the photoresist was removed. Thus, the thin-film positive electrode 110 was formed on the contact layer 107.

[4] Then, photoresist was applied, and a window was formed in a predetermined region on the exposed surface of the n⁺layer 103 through photolithography. After the interior of the vapor deposition apparatus was evacuated to a high vacuum on the order of $10^{-6}$ Torr or lower, a vanadium (V) layer 141 having a thickness of about 175 Å, an aluminum (Al) layer 142 having a thickness of about 1000 Å, a vanadium (V) layer 143 having a thickness of about 500 Å, a nickel (Ni) layer 144 having a thickness of about 5000 Å, and a gold (Au) layer 145 having a thickness of about 8000 Å were deposited successively. Subsequently, the photoresist was removed. Thus, the negative electrode 140 was formed on the exposed surface of the n⁺ layer 103.

[5] After the formation of the negative electrode 140, heat treatment was performed in order to reduce the contact resistance between the contact layer 107 and the thin-film positive electrode 110. Specifically, the atmosphere including the sample was rendered a vacuum by use of a vacuum pump, and $O_2$ gas was supplied so as to increase the pressure to 10 Pa. In this state, the temperature was increased to about 570° C., and heating was performed for about 4 minutes.

In order to form a thick-film positive electrode 120 on the thin-film positive electrode 110 formed in the above-described step, photoresist was applied uniformly, and a window was formed in the photoresist layer at a portion at which the thick-film positive electrode 120 was to be formed. Subsequently, a vanadium (V) layer 121 having a thickness of about 175 Å, a gold (Au) layer 122 having a thickness of about 15000 Å, and an aluminum (Al) layer 123 having a thickness of about 100 Å were successively formed through vapor deposition on the thin-film positive electrode 110. Thus, as in the step described in [4] above, the thick-film positive electrode 120 was formed by a lift-off method.

Afterwards, through electron beam vapor deposition, a protective film layer 130 of silicon dioxide ($SiO_2$) was uniformly formed on the uppermost layers exposed upwards. After the application of photoresist and the performance of a photolithography process, windows were formed in the photoresist layer such that portions of the thick-film positive electrode 120 and the negative electrode 140 were exposed to the outside.

Thus, the light-emitting element 100 was fabricated.

Step 2: Assembly of the light-emitting diode 200:

As shown in FIG. 1, the semiconductor light-emitting element 100 fabricated in the above-described fabrication step mounts onto an upper flat portion 203 of a lead 201. The negative electrode 140 connects to the lead 201 by means of a wire 204. The thick-film positive electrode 120 serving as an electrode pad for wire bonding connects to a lead 202 by means of a wire 205. Subsequently, a body that functions as a lens is formed from an insulating resin 206 such as epoxy resin through a potting process.

In the potting process, the insulating resin 206 such as epoxy resin seals the light-emitting element 100 from the upper side (the protective film layer 130 side) thereof such that the protective film layer 130 and the exposed surfaces of the electrodes 120 and 140 are covered by the insulating resin 206. Subsequently, to harden the insulating resin 206, the light-emitting diode 200 is heated. In general, such heating is performed at 120° C. for 1 hour and then at 150° C. for 4 hours. However, in the present embodiment, the heating is performed at 120° C. for 1 hour and then at 200° C. for 4 hours in order to intentionally produce excess residual stresses due to thermal shrinkage of the insulating resin 206. The thus-fabricated light-emitting diode is made suitable for a high-load durability test, which will be described later.

Step 3: Heat treatment of the light-emitting diode 200:

The light-emitting diode 200 fabricated in accordance with the above-described fabrication steps 1 and 2 is subjected to heat treatment (moistening treatment) in order to cause the insulting resin 206 to absorb moisture. This heat treatment is performed through storage for 50 hours at 1 atm and 85° C. in an atmosphere having a relative humidity of 90%.

The conditions of the heat treatment will be described later.

In this manner, the light-emitting diode 200 was fabricated in accordance with the above-described fabrication steps 1, 2, and 3.

Thus, when the light-emitting diode 200—whose insulating resin 206 is hardened at a higher temperature as compared with ordinary conditions which causes excess residual stresses—is subjected to a high-load durability test (a drive test performed at a high temperature, a high humidity, and a large current for an extended period of time), the protective film layer 130, the thin-film positive electrode 110, and other components remain unaffected. Therefore, the light-emitting diode 200 had stable light-emitting characteristics. This advantageous effect is obtained, because residual stresses that remain in the insulating resin 206 are relaxed sufficiently by the above-described heat treatment (storage for 50 hours at 1 atm and 85° C. in an atmosphere having a relative humidity of 90%) performed in the fabrication step 3.

The conditions of heat treatment of the light-emitting diode 200 will now be described:

In order to determine the conditions of heat treatment performed in the fabrication step 3, the following two experiments (a) and (b) were performed.

(a) Experiment on temperature dependency

The present experiment was performed on the light-emitting diode 200 which was fabricated in accordance with the above-described step 1 (fabrication of the semiconductor light-emitting element 100) and step 2 (assembly of the light-emitting diode 200). In order to investigate the relationship between atmospheric temperature (° C.) and required heat treatment time (hr) during the heat treatment step performed after the above steps 1 and 2, an experiment was implemented.

FIG. 3 is a table showing the results of this experiment. The symbol "o" in the table indicates that the light-emitting characteristics remained unchanged even after the high-load durability test (a drive test performed at a high temperature, a high humidity, and a large current for a long period of time), which was performed after the heat treatment step. In this experiment, the heat treatment was performed at a relative humidity of 90%.

Figure 4:
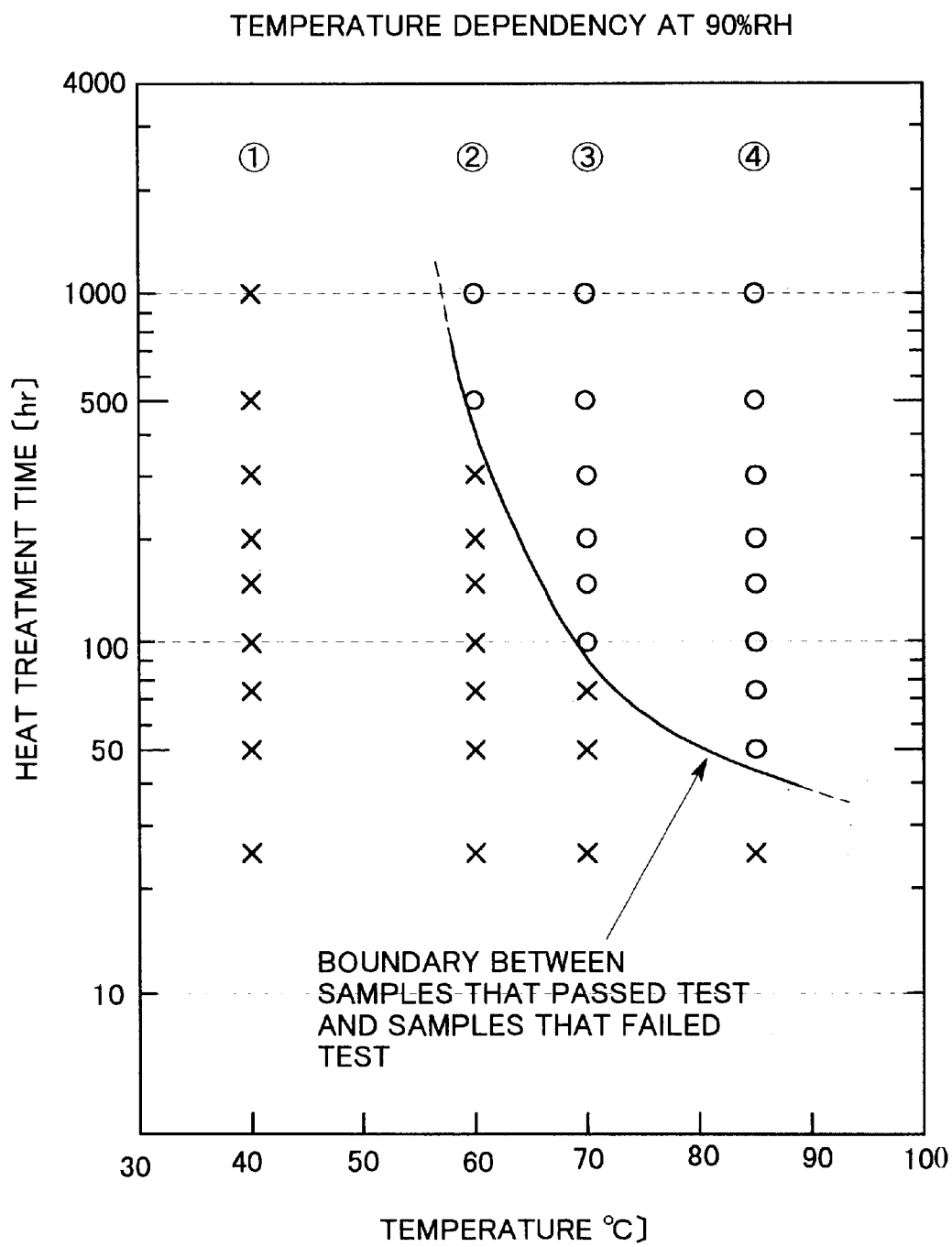
FIG. 4 is a graph showing results of the experiment for investigating the temperature dependency of the heat treatment of the present invention.

FIG. 4 shows a semilog graph in which the results of the experiment of FIG. 3 are plotted. A curve serving as a boundary between a region including the samples whose light-emitting characteristics changed due to the high-load durability test and a region including the samples whose light-emitting characteristics remained unchanged due to the high-load durability test is a monotonously decreasing function indicating that the required heat treatment time decreases as the temperature increases. The following conclusions can be derived from the results of the experiment:

1) The heat treatment time can be reduced through an increase in the heat treatment temperature from 60° C. toward 100° C. Referring to FIG. 4, for example, in group ②  (60° C.), a period of about 500 hours (about 3 weeks) was needed for completion of the heat treatment. In contrast, in group ④ (85° C.), a period of only 50 hours (about 2 days) was needed for completion of the heat treatment.

2) It is preferred that the heat treatment temperature be set equal to or greater than 60° C., because when the heat treatment temperature becomes lower than 60° C., the required heat treatment time abruptly becomes long, or obtaining sufficient effect of the heat treatment becomes more difficult.

(b) Experiment on humidity dependency

The present experiment was performed on the light-emitting diode 200 which was fabricated in accordance with the above-described step 1 (fabrication of the semiconductor light-emitting element 100) and step 2 (assembly of the light-emitting diode 200). In order to investigate the relationship between humidity (relative humidity (%) and absolute humidity (KPa)) and the required heat treatment time (hr) during the heat treatment step performed after the above steps 1 and 2, another experiment was performed.

FIG. 5 is a table showing the results of this experiment. As in the experiment (a) described above, the symbol in the table indicates that the light-emitting characteristics remained unchanged even after the high-load durability test. In this experiment, the heat treatment was performed at 85° C.

Figure 6:
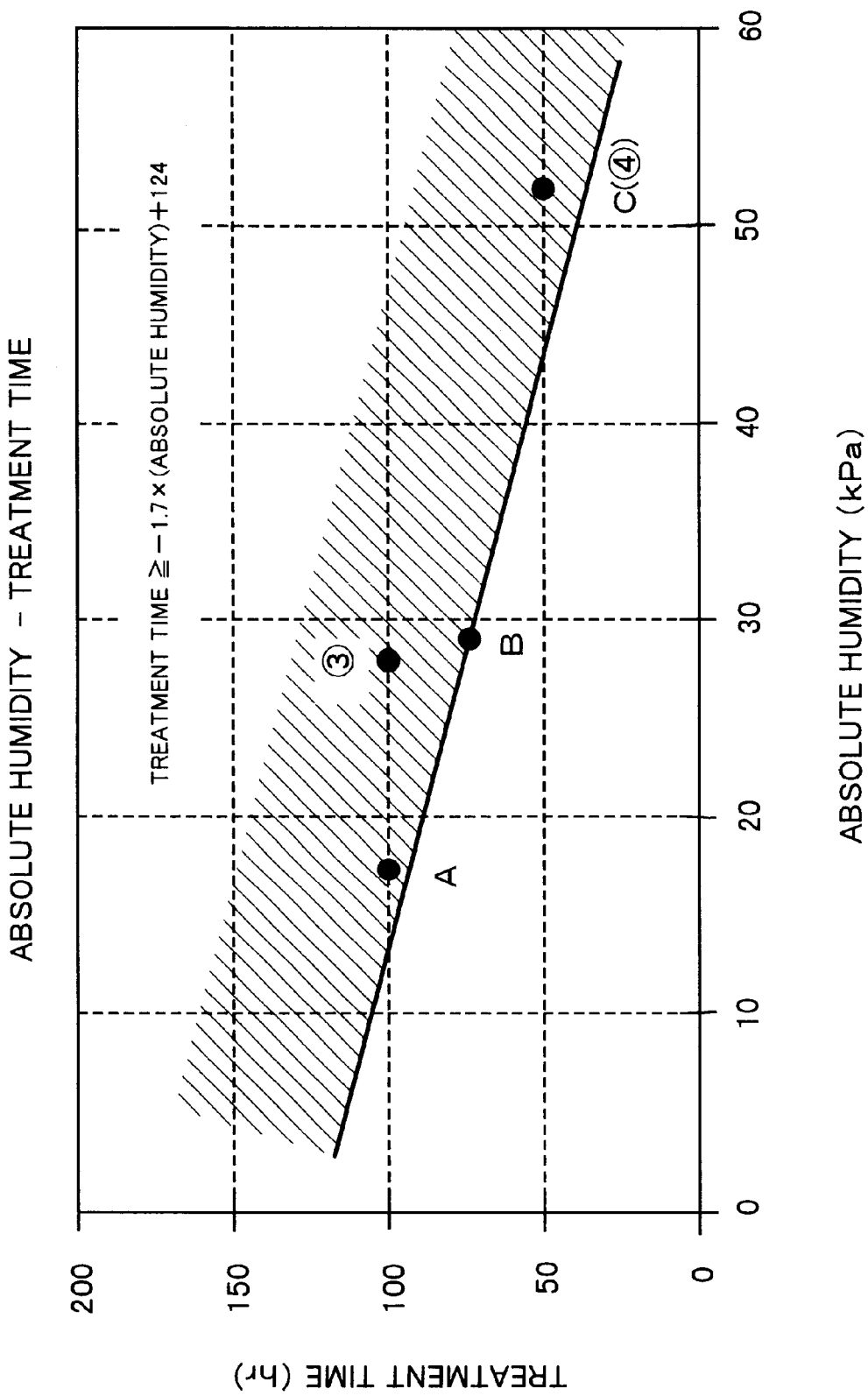
FIG. 6 is a graph showing results of the experiment for investigating the humidity dependency of the heat treatment of the present invention.

FIG. 6 is a graph in which the results of the experiment of FIG. 5 are plotted, wherein the relative humidity values in FIG. 5 are converted into values of absolute humidity (KPa). The graph of FIG. 5 further shows the minimum heat treatment times for groups ③ and ④, whose light-emitting characteristics remained unchanged even when the heat treatment time was shorter than 200 hours in the experiment (a).

As is apparent from this graph, a curve serving as a boundary between a region including the samples whose light-emitting characteristics changed due to the high-load durability test and a region including the samples whose light-emitting characteristics did not change due to the high-load durability test is a monotonously decreasing function. The following conclusions can be derived from the results of the experiment:

1) The heat treatment time T (hr) required to obtain stable light-emitting characteristics in the above-described high-load durability test can be represented by the following equation (1):

$$T > -1.7H + 124 \quad (1)$$

where H represents absolute humidity (KPa) of the heat treatment atmosphere.

2) It is preferred that the absolute humidity of the heat treatment atmosphere be set equal to or greater than 10 KPa, because when the absolute humidity becomes lower than 10 KPa, the required heat treatment time abruptly becomes longer, or obtaining sufficient effect of the heat treatment becomes more difficult.

3) It is more preferred that the absolute humidity of the heat treatment atmosphere be set equal to or greater than 50 KPa. When the heat treatment is performed at or above 50 KPa, the heat treatment can be completed within a shorter timeframe.

In experiments (a) and (b), the heat treatment was performed at 1 atm. However, when the pressure during the heat treatment is made higher than 1 atm, a desired atmosphere of high humidity and high temperature is obtained, and the heat treatment according to the present invention can be completed within a shorter time as compared with the cases of the above-described experiments (a) and (b).

While the invention has been described in terms of a certain preferred embodiment, other embodiments apparent to those of ordinary skill in the are also within the scope of this invention. Accordingly, the scope of the invention is intended to be defined only by the claims that follow.

What is claimed is:

1. A method of fabricating a semiconductor light-emitting element comprising:
   forming semiconductor light-emitting element having at least an electrode and a protective film, layer;
   sealing the semiconductor light-emitting element with an insulating resin;
   hardening the insulating resin at high temperature; and
   heat-treating the semiconductor light-emitting element in an atmosphere having humidity.

2. A method of fabricating a semiconductor light-emitting element according to claim 1, wherein the heat treatment is performed at a temperature of 60° C. or higher.

3. A method of fabricating a semiconductor light-emitting element according to claim 1, wherein the atmosphere has an absolute humidity of not less than 10 KPa.

4. A method of fabricating a semiconductor light-emitting element according to claim 2, wherein the atmosphere has an absolute humidity of not less than 10 KPa.

5. A method of fabricating a semiconductor light-emitting element according to claim 1, wherein the atmosphere has an absolute humidity of not less than 50 KPa.

6. A method of fabricating a semiconductor light-emitting element according to claim 2, wherein the atmosphere has an absolute humidity of not less than 50 KPa.

7. A method of fabricating a semiconductor light-emitting element according to claim 1, wherein the heat treatment is performed at a pressure of 1 atm or higher.

8. A method of fabricating a semiconductor light-emitting element according to claim 2, wherein the heat treatment is performed at a pressure of 1 atm or higher.

9. A method of fabricating a semiconductor light-emitting element according to claim 3, wherein the heat treatment is performed at a pressure of 1 atm or higher.

10. A method of fabricating a semiconductor light-emitting element according to claim 4, wherein the heat treatment is performed at a pressure of 1 atm or higher.

11. A method of fabricating a semiconductor light-emitting element according to claim 5, wherein the heat treatment is performed at a pressure of 1 atm or higher.

12. A method of fabricating a semiconductor light-emitting element according to claim 6, wherein the heat treatment is performed at a pressure of 1 atm or higher.

* * * * *